(12) United States Patent
Tanaka et al.

(10) Patent No.: US 9,070,549 B2
(45) Date of Patent: Jun. 30, 2015

(54) SUBSTRATE PROCESSING APPARATUS AND SUBSTRATE PROCESSING METHOD

(75) Inventors: Hiroshi Tanaka, Tosu (JP); Toshiyuki Shiokawa, Tosu (JP); Takao Inada, Tosu (JP)

(73) Assignee: Tokyo Electron Limited, Minato-Ku (JP)

( * ) Notice: Subject to any disclaimer, the term of this patent is extended or adjusted under 35 U.S.C. 154(b) by 833 days.

(21) Appl. No.: 12/680,799

(22) PCT Filed: Sep. 22, 2008

(86) PCT No.: PCT/JP2008/067101
§ 371 (c)(1), (2), (4) Date: Mar. 30, 2010

(87) PCT Pub. No.: WO2009/044646
PCT Pub. Date: Apr. 9, 2009

(65) Prior Publication Data
US 2010/0218791 A1    Sep. 2, 2010

(30) Foreign Application Priority Data

Oct. 1, 2007 (JP) ................................ 2007-257806
Dec. 19, 2007 (JP) ................................ 2007-327442

(51) Int. Cl.
*B08B 5/02* (2006.01)
*H01L 21/02* (2006.01)
*H01L 21/67* (2006.01)

(52) U.S. Cl.
CPC .... *H01L 21/02052* (2013.01); *H01L 21/67028* (2013.01)

(58) Field of Classification Search
CPC ................ H01L 21/67034; H01L 21/67028; H01L 21/02052
USPC ..................................... 134/30, 135, 37, 902
See application file for complete search history.

(56) References Cited

U.S. PATENT DOCUMENTS 5,520,744 A  *  5/1996  Fujikawa et al. ............... 134/11
6,068,002 A     5/2000  Kamikawa et al.
(Continued)

FOREIGN PATENT DOCUMENTS

JP    10-163164 A1    6/1998
JP    10-284459 A1    10/1998
(Continued)

OTHER PUBLICATIONS

Machine translation of JP 2006-332244A.*
(Continued)

*Primary Examiner* — Michael Kornakov
*Assistant Examiner* — Douglas Lee
(74) *Attorney, Agent, or Firm* — Burr & Brown, PLLC

(57) ABSTRACT

A drying gas is supplied into a drying chamber in a substantially horizontal direction, an obliquely downward direction descendent from the substantially horizontal direction, or a vertically downward direction under a state where a wafer is immersed in a cleaning liquid in a cleaning tank. The wafer is moved from the cleaning tank into the drying chamber, with the drying gas being supplied into the drying chamber. At this time, the supply of the drying gas into the drying chamber is stopped, under a condition where a part of the wafer is immersed in the cleaning liquid stored in the cleaning tank. After the movement of the wafer into the drying chamber has been finished, a drying gas is supplied into the drying chamber in an obliquely upward direction ascendant from the substantially horizontal direction or a vertically upward direction.

18 Claims, 8 Drawing Sheets

(56) References Cited

U.S. PATENT DOCUMENTS

| | | | |
|---|---|---|---|
| 6,164,297 A * | 12/2000 | Kamikawa | 134/61 |
| 6,171,403 B1 | 1/2001 | Kamikawa et al. | |
| 6,319,329 B1 * | 11/2001 | Kamikawa et al. | 134/2 |
| 2001/0007259 A1 * | 7/2001 | Nakashima et al. | 134/32 |
| 2006/0112973 A1 * | 6/2006 | Nagami | 134/26 |
| 2006/0266386 A1 * | 11/2006 | Cho et al. | 134/63 |

FOREIGN PATENT DOCUMENTS

| | | | |
|---|---|---|---|
| JP | 11-016876 A1 | 1/1999 | |
| JP | 2002-299310 A1 | 10/2002 | |
| JP | 2003-075067 A1 | 3/2003 | |
| JP | 2006-332244 A1 | 12/2006 | |
| JP | 2006-332642 A1 | 12/2006 | |
| JP | 2006332244 A * | 12/2006 | |

OTHER PUBLICATIONS

Machine translation of JP2006-332244A.*

Japanese Office Action dated Mar. 6, 2012 (with English translation).

* cited by examiner

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method, which immerse a substrate to be processed, such as a semiconductor wafer or an LCD glass substrate, into a cleaning liquid such as a chemical liquid or a rinse liquid, and thereafter dry the substrate to be processed. More particularly, the present invention relates to a substrate processing apparatus and a substrate processing method, which are capable of uniformly and promptly drying the surface of the substrate to be processed.

2. Description of Related Art

In a general manufacturing process of a semiconductor manufacturing apparatus, there has been widely employed a cleaning method in which a substrate to be processed (hereinafter referred to as "wafer"), such as a semiconductor wafer or an LCD glass, is cleaned in a sequential order by immersing the wafer into a cleaning tank storing a cleaning liquid such as a chemical liquid or a rinse liquid. In addition, there has been known a drying method in which a drying gas formed of a steam of organic solvent having volatility, such as IPA (isopropyl alcohol), is brought into contact with a surface of the cleaned wafer, such that the steam of the drying gas can condense on or adsorb on the surface of the wafer, and thereafter an inert gas such as $N_2$ gas is supplied to the surface of the wafer so as to remove the moisture on the surface of the wafer whereby the surface of the wafer is dried.

A conventional cleaning and drying apparatus for performing a cleaning and drying method of this type has the following structure. Namely, a hood (lid member) capable of being opened and closed is disposed on an upper opening of a cleaning tank storing a cleaning liquid such as a chemical liquid or a rinse liquid, and a drying chamber is formed inside the hood (see, for example, JP10-284459A and JP11-16876A).

In the conventional cleaning and drying apparatus shown in JP10-284459A and JP11-16876A, a wafer is firstly immersed into the cleaning liquid stored in the cleaning tank, and then the wafer is cleaned. Thereafter, the wafer is drawn up from the cleaning liquid in the cleaning tank, and is moved into the drying chamber disposed above the cleaning tank. Then, the drying chamber is hermetically closed by a shutter or the like, with the wafer being accommodated in the drying chamber. Following thereto, a drying gas is supplied into the drying chamber so as to be brought into contact with the surface of the wafer, such that the steam of the drying gas can condense on or adsorb on the surface of the wafer. After that, an inert gas is supplied to the surface of the wafer so as to remove the moisture on the surface of the wafer whereby the surface of the wafer is dried.

SUMMARY OF THE INVENTION

However, in the aforementioned cleaning and drying method, the wafer is drawn up from the cleaning liquid in the cleaning tank and is moved into the drying chamber disposed above the cleaning tank, and then a drying gas is supplied into the drying chamber. Namely, it takes time between a timing when the drawing-up of the wafer from the cleaning liquid in the cleaning tank is started and a timing when the drying gas is supplied onto the surface of the wafer. Thus, there is a possibility that the surface of the wafer might not be uniformly dried, resulting in formation of watermarks on the surface of the wafer which might be caused by droplets of the cleaning liquid adhering to the surface of the wafer.

There can be considered a method in which, before the wafer is drawn up from the cleaning liquid in the cleaning tank, a drying gas formed of a steam of organic solvent having volatility, such as IPA (isopropyl alcohol), is supplied into the drying camber in an upward direction or an obliquely upward direction so that the drying chamber is filled with the drying gas, and that a liquid film of the drying gas is formed on the cleaning liquid in the cleaning tank. However, in such a method, since the drying gas is supplied in the upward direction or the obliquely upward direction, the drying gas of relatively a high temperature may be directly blown onto an upper wall of the drying chamber. In this case, water condensation on the upper wall of the drying chamber might be caused by the drying gas of a high temperature.

The present invention has been made in view of the above circumstances. The object of the present invention is to provide a substrate processing apparatus and a substrate processing method, capable of reducing a time period between a timing when the drawing-up of the substrate to be processed from the cleaning liquid in the cleaning tank is started and a timing when the drying gas is supplied onto a surface of the substrate to be processed. Thus, the present invention is capable of drying uniformly and promptly drying the surface of the substrate to be processed. The present invention is furthermore capable of restraining formation of watermarks on the surface of the substrate to be processed by droplets of the cleaning liquid adhering to the surface of the substrate to be processed.

A substrate processing apparatus of the present invention is a substrate processing apparatus comprising: a cleaning tank configured to store a cleaning liquid for a substrate to be processed; a drying chamber disposed above the cleaning tank, the drying chamber including a gas supply part therein, the gas supply part being configured to supply a drying gas; a holding part configured to hold a substrate to be processed and to move the substrate to be processed between the cleaning tank and the drying chamber; and a control device configured to control the gas supply part and the holding part in such a manner that a substrate to be processed is firstly immersed into the cleaning liquid stored in the cleaning tank, that a drying gas is then supplied into the drying chamber from the gas supply part in a substantially horizontal direction, an obliquely downward direction descendent from the substantially horizontal direction, or a vertically downward direction, and that the substrate to be processed is moved by the holding part from the cleaning tank into the drying chamber with the drying gas being supplied into the drying chamber from the gas supply part, and in such a manner that, during this movement of the substrate to be processed from the cleaning tank into the drying chamber, the supply of the drying gas into the drying chamber is stopped, under a condition where a part of the substrate to be processed is immersed in the cleaning liquid in the cleaning tank, and that a drying gas is supplied into the drying chamber in an obliquely upward direction ascendant from the substantially horizontal direction or a vertically upward direction, after the movement of the substrate to be processed into the drying chamber has been finished.

A substrate processing method of the present invention is a substrate processing method for a substrate to be processed, with the use of a substrate processing apparatus comprising a cleaning tank configured to store a cleaning liquid for a substrate to be processed and a drying chamber disposed above the cleaning tank, the substrate processing method comprising: immersing a substrate to be processed into the cleaning liquid stored in the cleaning tank; supplying a drying gas into the drying chamber in a substantially horizontal direction, an obliquely downward direction descendent from the substantially horizontal direction, or a vertically downward direction; moving the substrate to be processed from the cleaning tank into the drying chamber with the drying gas being supplied into the drying chamber, and, during this movement of the substrate to be processed from the cleaning tank into the drying chamber, stopping the supply of the drying gas into the drying gas under a condition where a part of the substrate to be processed is immersed in the cleaning liquid in the cleaning tank; and supplying a drying gas into the drying chamber in an obliquely upward direction ascendant from the substantially horizontal direction or a vertically upward direction, after the movement of the substrate to be processed into the drying chamber has been finished.

In the aforementioned substrate processing apparatus and the substrate processing method, the drying gas is preferably formed of a steam of organic solvent having volatility, such as IPA (isopropyl alcohol), in particular. However, the drying gas may be formed of a material other than a steam of organic solvent.

According to such a substrate processing apparatus and such a substrate processing method, the substrate to be processed is moved from the cleaning tank into the drying chamber, with the drying gas having been already supplied into the drying chamber. Thus, it is possible to reduce a time period between a timing when the drawing-up of the substrate to be processed from the cleaning liquid in the cleaning tank is started and a timing when the drying gas is supplied onto the surface of the substrate to be processed. Thus, it is possible to uniformly and promptly dry the surface of the substrate to be processed, and to restrain formation of watermarks on the surface of the substrate to be processed by droplets of the cleaning liquid adhering to the surface of the substrate to be processed.

In addition, when the substrate to be processed is drawn up from the cleaning liquid in the cleaning tank, since the drying gas is supplied in the substantially horizontal direction, the obliquely downward direction descendent from the substantially horizontal direction, or the vertically downward direction, a liquid film of the drying gas can be formed on the cleaning liquid in the cleaning tank. Thus, when the substrate to be processed is drawn up from the cleaning tank, the liquid film of the drying gas can be adhered to the surface of the substrate to be processed. In addition, since the drying gas is supplied in the substantially horizontal direction, the obliquely downward direction descendent from the substantially horizontal direction, or the vertically downward direction, there is no possibility that the drying gas of relatively a high temperature is directly blown onto the upper wall constituting the drying chamber, whereby water condensation on the upper wall of the drying chamber, which might be caused by such a drying gas, can be prevented.

In addition, while the substrate to be processed is drawn up toward the drying chamber, the supply of the drying gas is stopped under the condition where a part of the substrate to be processed remains immersed in the cleaning liquid stored in the cleaning tank. Namely, it is not necessary to supply the drying gas throughout the overall step during when the substrate to be processed is moved from the cleaning tank into the drying chamber. That is, even when the supply of the drying gas is stopped under the condition where a part of the substrate to be processed is taken out from the cleaning liquid in the cleaning tank, the drying gas can pervade substantially the whole surface of the substrate to be processed due to a diffusion property of the drying gas. As a result, an amount of the drying gas used therefor can be saved.

Further, the drying gas is supplied into the drying chamber in the obliquely upward direction ascendant from the substantially horizontal direction or the vertically upward direction, after the movement of the substrate to be processed into the drying chamber has been finished. Thus, the drying gas once abuts on the upper wall constituting the drying chamber and then uniformly flows downward, whereby the steam of the drying gas can uniformly condense on or adsorb on the surface of the substrate to be processed. As a result, it is possible to uniformly remove the moisture on the surface of the substrate to be processed whereby the overall surface of the substrate to be processed can be uniformly dried.

In the substrate processing apparatus according to the present invention, it is preferable that the gas supply part is configured to freely vary a direction in which the drying gas is supplied. In particular, it is preferable that the gas supply part includes a cylindrical member that is extended in the substantially horizontal direction, a plurality of holes formed in the cylindrical member, and a rotational driving mechanism configured to rotate and drive the cylindrical member, that the drying gas is supplied from an inside of the cylindrical member to an outside of the cylindrical member through the holes, and that the rotational driving mechanism rotates and drives the cylindrical member such that a direction in which the drying gas is supplied can be freely varied. According to such a substrate processing apparatus, the drying gas can be supplied into the drying chamber in various directions, without increasing the number of cylindrical members constituting a gas supply part.

Alternatively, in the substrate processing apparatus of the present invention, it is preferable that the gas supply part is composed of a first gas-supply portion configured to supply the drying gas in the substantially horizontal direction, the obliquely downward direction descendent from the substantially horizontal direction, or the vertically downward direction, and a second gas-supply portion configured to supply the drying gas in the obliquely upward direction ascendant from the substantially horizontal direction or the vertically upward direction, and that the first gas-supply portion is configured to supply the drying gas into the drying chamber in the substantially horizontal direction, the obliquely downward direction descendent from the substantially horizontal direction, or the vertically downward direction, under a condition where the substrate to be processed is immersed in the cleaning liquid in the cleaning tank, and the second gas-supply portion is configured to supply the drying gas in the obliquely upward direction ascendant from the substantially horizontal direction or the vertically upward direction, after the movement of the substrate to be processed into the drying chamber has been finished. According to such a substrate processing apparatus, the first gas-supply portion can supply the drying gas into the drying chamber in the substantially horizontal direction, the obliquely downward direction descendent from the substantially horizontal direction, or the vertically downward direction, and the second gas-supply portion can supply the drying gas into the drying chamber in the obliquely upward direction ascendant from the substantially horizontal direction or the vertically upward direction. Thus, the directions in which the drying gas is supplied into the drying chamber can be easily switched by changing the gas supply portions to be used, depending on a case in which the substrate to be processed is moved from the cleaning tank into the drying chamber and a case in which the substrate to be processed is accommodated in the drying chamber.

In this case, it is preferable that the first gas-supply portion is configured to supply the drying gas into the drying chamber in the substantially horizontal direction. Alternatively, it is preferable that the first gas-supply portion is configured to supply the drying gas into the drying chamber in the vertically downward direction. Thus, there is no possibility that the drying gas of relatively a high temperature is directly blown onto the upper wall constituting the drying chamber, whereby water condensation on the upper wall of the drying chamber, which might be caused by such a drying gas, can be prevented.

In addition, in this case, it is preferable that the first gas-supply portion and the second gas-supply portion are arranged close to each other in the drying chamber in an up and down direction thereof.

In addition, in the substrate processing apparatus of the present invention, it is preferable that the drying chamber is hermetically closed, when the drying gas is supplied into the drying chamber from the gas supply part in the obliquely upward direction ascendant from the substantially horizontal direction or the vertically upward direction after the movement of the substrate to be processed into the drying chamber has been finished. Thus, the stream of the drying gas supplied into the drying chamber can effectively condense on or absorb on the surface of the substrate to be processed.

In the substrate processing method of the present invention, it is preferable that the drying gas is supplied into the drying chamber in the substantially horizontal direction, under the condition where the substrate to be processed is immersed in the cleaning liquid stored in the cleaning tank. Alternatively, it is preferable that the drying gas is supplied into the drying chamber in the vertically downward direction, under the condition where the substrate to be processed is immersed in the cleaning liquid stored in the cleaning tank. Thus, there is no possibility that the drying gas of relatively a high temperature is directly blown onto the upper wall constituting the drying chamber, whereby water condensation on the upper wall of the drying chamber, which might be caused by such a drying gas, can be prevented.

In addition, in the substrate processing method according to the present invention, it is preferable that when the substrate to be processed is moved from the cleaning tank into the drying chamber with the drying gas being supplied into the drying chamber, the substrate to be processed is continuously moved from the cleaning tank into the drying chamber without being stopped. According to such a substrate processing method, it is possible to promptly move the substrate to be processed from the cleaning tank into the drying chamber.

In addition, in the substrate processing method of the present invention, it is preferable that the drying chamber is hermetically closed, when the drying gas is supplied into the drying chamber in the obliquely upward direction ascendant from the substantially horizontal direction or the vertically upward direction after the movement of the substrate to be processed into the drying chamber has been finished. Thus, the steam of the drying gas supplied into the drying chamber can effectively condense on or adsorb on the surface of the substrate to be processed.

In addition, in the substrate processing apparatus of the present invention, it is preferable that there is provided a gas discharge part configured to selectively discharge the drying gas from the drying chamber, and that the control device controls the gas discharge part in such a manner that, when the drying gas is supplied from the gas supply part into the drying chamber, the drying gas is discharged by the gas discharge part from the drying chamber, and that, when the supply of the drying gas into the drying chamber is stopped, the discharge of the drying gas by the gas discharge part from the drying chamber is stopped. Alternatively, in the substrate processing method of the present invention, it is preferable that the drying gas is selectively discharged from the drying chamber, and that when the drying gas is supplied into the drying chamber, the drying gas is discharged from the drying chamber, and, when the supply of the drying gas into the drying chamber is stopped, the discharge of the drying gas from the drying chamber is stopped. Thus, while the supply of the drying gas into the drying chamber is stopped, the drying gas contained in the drying gas can be prevented from being discharged outside. Thus, since the lowering of concentration of the drying gas in the drying chamber can be prevented without any disturbance of the drying gas atmosphere in the drying chamber, the atmosphere of the drying gas can be uniformly maintained. Therefore, even while the supply of the drying gas into the drying chamber is stopped, it is possible to more promptly dry the substrate to be processed, as well as it is possible to restrain the formation of watermarks on the surface of the substrate to be processed.

In addition, in the substrate processing apparatus of the present invention, it is preferable that the control device controls the holding part in such a manner that, when the holding part moves the substrate to be processed from the cleaning tank into the drying chamber, a transfer speed at which the substrate to be processed is moved from a condition where the substrate to be processed is just completely exposed from the cleaning liquid stored in the cleaning tank to a condition where the movement of the substrate to be processed into the drying chamber is finished, is greater than a transfer speed at which the substrate to be processed is moved from a condition where the substrate to be processed is accommodated in the cleaning tank to the condition where the substrate to be processed is just completely exposed from the cleaning liquid stored in the cleaning tank. Alternatively, in the substrate processing method of the present invention, it is preferable that when the substrate to be processed is moved from the cleaning tank into the drying chamber, the substrate to be processed is moved from the cleaning tank into the drying chamber in such a manner that a transfer speed at which the substrate to be processed is moved from a condition where the substrate to be processed is just completely exposed from the cleaning liquid stored in the cleaning tank to a condition where the movement of the substrate to be processed into the drying chamber is finished, is greater than a transfer speed at which the substrate to be processed is moved from a condition where the substrate to be processed is accommodated in the cleaning tank to the condition where the substrate to be processed is just completely exposed from the cleaning liquid stored in the cleaning tank. Thus, it is possible to further reduce a time period required for the substrate to be processed to be moved from the cleaning tank into the drying chamber.

Another substrate processing apparatus of the present invention is a substrate processing apparatus comprising: a cleaning tank configured to store a cleaning liquid for a substrate to be processed; a drying chamber disposed above the cleaning tank, the drying chamber including a gas supply part therein, the gas supply part being configured to supply a drying gas; a holding part configured to hold a substrate to be processed and to move the substrate to be processed between the cleaning tank and the drying chamber; and a control device configured to control the gas supply part and the holding part in such a manner that a substrate to be processed is firstly immersed into the cleaning liquid stored in the cleaning tank, that a drying gas is then supplied into the drying chamber from the gas supply part in a substantially horizontal direction, an obliquely downward direction descendent from the substantially horizontal direction, or a vertically downward direction and then the supply of the drying gas into the drying chamber by the gas supply part is stopped, and that thereafter the substrate to be processed is moved by the holding part from the cleaning tank into the drying chamber, and in such a manner that, during this movement of the substrate to be processed from the cleaning tank into the drying chamber, a drying gas is supplied into the drying chamber in the substantially horizontal direction, the obliquely downward direction descendent from the substantially horizontal direction, or the vertically downward direction, under a condition where a part of the substrate to be processed is immersed in the cleaning liquid stored in the cleaning tank, and that a drying gas is supplied into the drying chamber in an obliquely upward direction ascendant from the substantially horizontal direction or a vertically upward direction, after the movement of the substrate to be processed into the drying chamber has been finished.

In addition, another substrate processing method of the present invention is a substrate processing method for a substrate to be processed, with the use of a substrate processing apparatus comprising a cleaning tank configured to store a cleaning liquid for a substrate to be processed and a drying chamber disposed above the cleaning tank, the substrate processing method comprising: immersing a substrate to be processed into the cleaning liquid stored in the cleaning tank; supplying a drying gas into the drying chamber in a substantially horizontal direction, an obliquely downward direction descendent from the substantially horizontal direction, or a vertically downward direction; stopping the supply of the drying gas into the drying chamber, then moving the substrate to be processed from the cleaning tank into the drying chamber, and, during this movement of the substrate to be processed from the cleaning tank into the drying chamber, supplying a drying gas into the drying chamber in the substantially horizontal direction, the obliquely downward direction descendent from the substantially horizontal direction, or the vertically downward direction, under a condition where a part of the substrate to be processed is immersed in the cleaning liquid stored in the cleaning tank; and supplying a drying gas into the drying chamber in an obliquely upward direction ascendant from the substantially horizontal direction or a vertically upward direction, after the movement of the substrate to be processed into the drying chamber has been finished.

According to such a substrate processing apparatus and such a substrate processing method, the drying is firstly supplied into the drying chamber, and the supply of the drying gas into the drying chamber is stopped before the substrate to be processed is drawn up from the cleaning tank into the drying chamber. Thus, when the substrate to be processed is moved into the drying chamber, the drying chamber has been already filled with the drying gas atmosphere, and the liquid film of the drying gas has been formed on the cleaning liquid in the cleaning tank. Thus, it is possible to reduce a time period between a timing when the drawing-up of the substrate to be processed from the cleaning liquid in the cleaning tank is started and a timing when the drying gas is supplied onto the surface of the substrate to be processed. Thus, it is possible to uniformly and promptly dry the surface of the substrate to be processed, and to restrain formation of watermarks on the surface of the substrate to be processed by droplets of the cleaning liquid adhering to the surface of the substrate to be processed.

In addition, when the substrate to be processed is drawn up from the cleaning liquid in the cleaning tank, since the drying gas is supplied in the substantially horizontal direction, the obliquely downward direction descendent from the substantially horizontal direction, or the vertically downward direction, the liquid film of the drying gas, which has been as described above, can be formed on the cleaning liquid in the cleaning tank. In addition, since the drying gas is supplied in the substantially horizontal direction, the obliquely downward direction descendent from the substantially horizontal direction, or the vertically downward direction, there is no possibility that the drying gas of relatively a high temperature is directly blown onto the upper wall constituting the drying chamber, whereby water condensation on the upper wall of the drying chamber, which might be caused by such a drying gas, can be prevented.

In addition, when the substrate to be processed is drawn up toward the drying chamber, the supply of the drying gas is stopped. Then, the supply of the drying gas into the drying chamber is restarted, under the condition where a part of the substrate to be processed remains immersed in the cleaning liquid stored in the cleaning tank. Namely, it is not necessary to supply the drying gas throughout the overall step during when the substrate to be processed is moved from the cleaning tank into the drying chamber. That is, even when the supply of the drying gas is restarted under the condition where a part of the substrate to be processed is taken out from the cleaning liquid in the cleaning tank, the drying chamber has been already filled with the drying gas atmosphere, and the liquid film of the drying gas has been formed on the cleaning liquid in the cleaning tank. Thus, the drying gas can pervade substantially the whole surface of the substrate to be processed due to a diffusion property of the drying gas. As a result, an amount of the drying gas used therefor can be saved.

In addition, the drying gas is supplied into the drying chamber in the obliquely upward direction ascendant from the substantially horizontal direction or the vertically upward direction, after the movement of the substrate to be processed into the drying chamber has been finished. Thus, the drying gas once abuts on the upper wall constituting the drying chamber and then uniformly flows downward, whereby the steam of the drying gas can uniformly condense on or adsorb on the surface of the substrate to be processed. As a result, it is possible to uniformly remove the moisture on the surface of the substrate to be processed whereby the overall surface of the substrate to be processed can be uniformly dried.

DETAILED DESCRIPTION OF THE INVENTION

An embodiment of the present invention will be described in detail below with reference to the drawings. Given herein as an example to describe this embodiment is a case where the present invention is applied to a cleaning system for semiconductor wafers.

Figure 1:
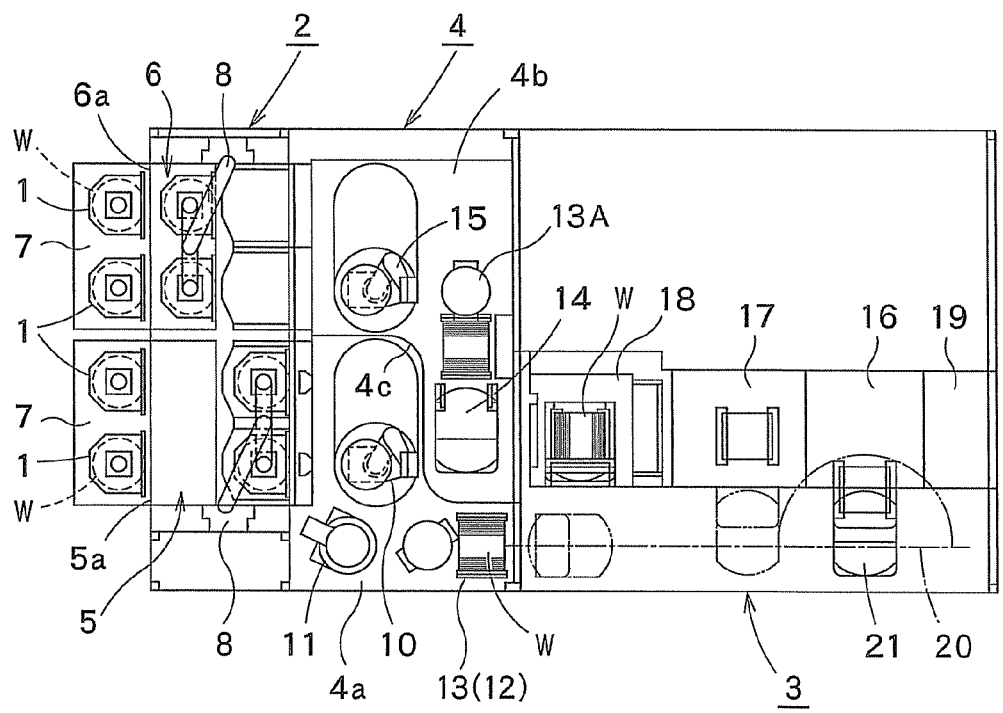
FIG. 1 is a schematic plan view showing an example of a cleaning system to which a substrate processing apparatus according to the present invention is applied.
Figure 2:
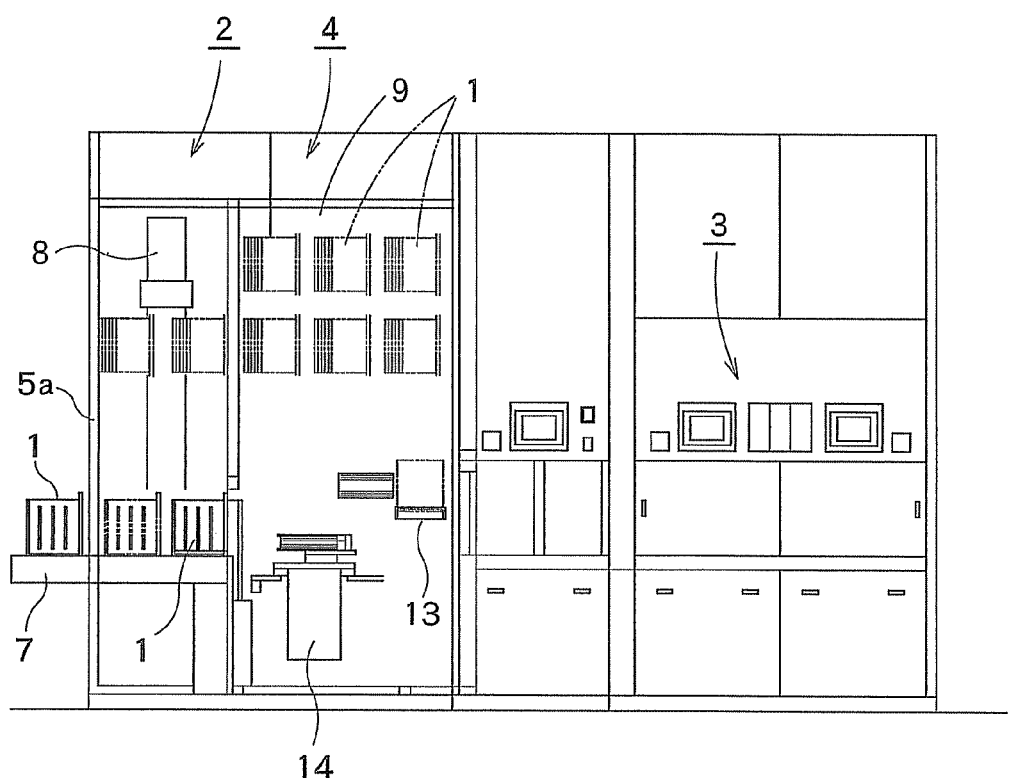
FIG. 2 is a schematic side view of the cleaning system shown in FIG. 1.

FIG. 1 is a schematic plan view showing an example of the cleaning system to which the substrate processing apparatus according to the present invention is applied. FIG. 2 is a schematic side view thereof.

The cleaning system shown in FIGS. 1 and 2 is mainly composed of: a transfer part 2 configured to load and unload a container, such as a carrier 1, which horizontally accommodates semiconductor wafers W (hereinafter referred to as "wafers") as objects to be processed; a processing part 3 configured to liquid-process wafers W by a chemical liquid and/or a cleaning liquid, and to dry the wafers W; and an interface part 4 interposed between the transfer part 2 and the processing part 3, the interface part 4 being configured to send and receive wafers W, to adjust positions thereof, and to change postures thereof.

The transfer part 2 includes a loading part 5 and an unloading part 6 which are disposed adjacent to each other on one side part of the cleaning system. The loading part 5 and the unloading part 6 respectively have a loading opening 5a and an unloading opening 6a through which the carrier 1 can pass. The loading opening 5a and the unloading opening 6a are respectively provided with slidable tables 7 by which the carrier 1 can be loaded and unloaded to and from the loading part 5 and the unloading part 6. The loading part 5 and the unloading part 6 respectively have carrier lifters 8. Due to the carrier lifters 8, the carrier 1 can be transferred between the loading parts or the unloading parts, and the vacant carrier 1 can be sent to a carrier standby part 9 disposed in an upper area of the transfer part 2 and can be received from the carrier standby part 9 (see, FIG. 2).

The interface part 4 is divided by a partition wall 4c into a first chamber 4a adjacent to the loading part 5 and a second chamber 4b adjacent to the unloading part 6. Disposed in the first chamber 4a are a wafer taking-out arm 10, a notch aligner 11, a distance adjusting mechanism 12, and a first posture changing apparatus 13. The wafer taking-out arm 10 can be moved in a horizontal direction (X•Y direction) and a vertical direction (Z direction), and can be rotated in a θ direction so as to take out and transfer a plurality of wafers W from the carrier 1 in the loading part 5. The notch aligner 11 is configured to detect notches formed in the wafers W. The distance adjusting mechanism 12 is configured to adjust distances between the plurality of wafers W which are taken out by the wafer taking-out arm 10. The first posture changing apparatus 13 is configured to change the postures of the wafers W from the horizontal state to the vertical state.

Disposed in the second chamber 4b are a wafer transfer arm 14, a second posture changing apparatus 13A, and a wafer placing arm 15. The wafer transfer arm 14 is configured to receive the plurality of processed wafers W in the vertical state from the processing part 3. The second posture changing apparatus 13A is configured to change the postures of the wafers W, which have been received from the wafer transfer arm 14, from the vertical state to the horizontal state. The wafer placing arm 15 can be moved in the horizontal direction (X•Y direction) and the vertical direction (Z direction), and can be rotated in the θ direction so as to receive the plurality of wafers W, whose postures have been changed to the horizontal state by the second posture changing apparatus 13A, and to place the wafers W in the vacant carrier 1, which have been transferred to the unloading part 6. The second chamber 4b is hermetically closed from outside, and thus an atmosphere in the chamber can be replaced with an inert gas such as nitrogen ($N_2$) gas which is supplied from a supply source, not shown, for supplying an inert gas such as $N_2$ gas.

On the other hand, in the processing part 3, there are arranged in a line a first processing unit 16, a second processing unit 17, a cleaning and drying unit 18, and a chuck cleaning unit 19. The first processing unit 16 is configured to remove particles and organic contaminations adhering to the wafers W. The second processing unit 17 is configured to remove metal contaminations adhering to the wafers W. The cleaning and drying unit 18 is configured to remove a chemical oxide film adhering to the wafers W and to dry the wafers W. Disposed in a transfer path 20, which is located on a position in opposition to these units 16 to 19, is a wafer transfer arm 21 that can be moved in the horizontal direction (X•Y direction) and the vertical direction (Z direction), and can be rotated in the θ direction.

Figure 3:
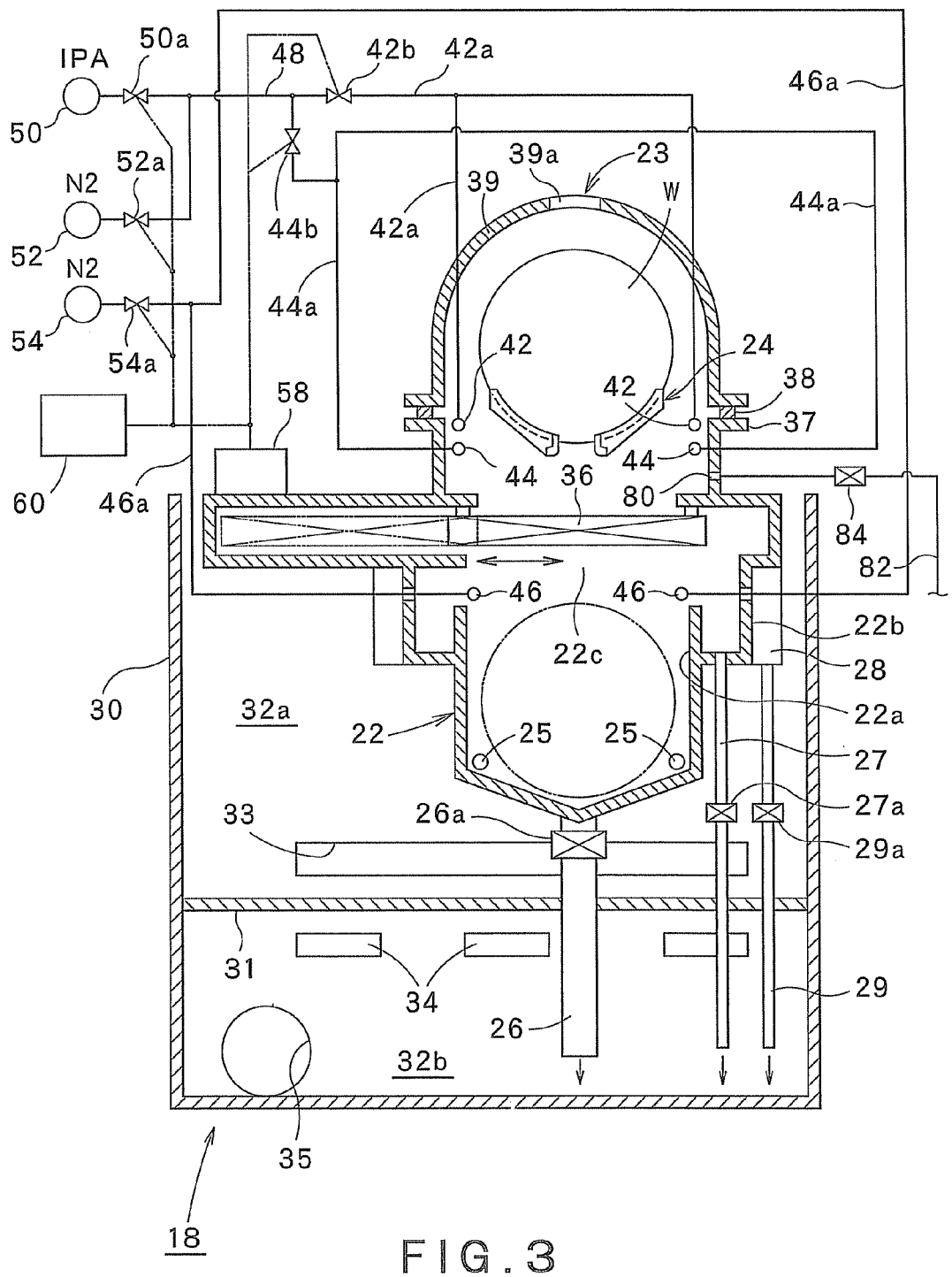
FIG. 3 is a sectional view of the substrate processing apparatus according to the present invention.

Next, details of the structure of the substrate processing apparatus (cleaning and drying unit 18) according to the present invention are described below with reference to FIG. 3. FIG. 3 is a sectional view of the substrate processing apparatus according to the present invention.

As shown in FIG. 3, the cleaning and drying unit 18 is mainly composed of a cleaning tank 22, a drying chamber 23 disposed above the cleaning tank 22, and a wafer board 24 (holding part). The cleaning tank 22 stores (accommodates) a cleaning liquid such as a chemical liquid, i.e., hydrofluoric acid or a deionized water. Wafers W can be immersed into the cleaning liquid stored in the cleaning tank 22. The wafer board 24 is configured to hold a plurality of, e.g., fifty wafers W and to move the wafers W between the cleaning tank 22 and the drying chamber 23. The cleaning and drying unit 18 is equipped with a control device 60 configured to control the respective constituent elements.

The cleaning tank 22 includes an inner tank 22a made of, e.g., a quartz member or a polypropylene member, and an outer tank 22b arranged on an upper outer portion of the inner tank 22a so as to receive a cleaning liquid overflowing from the inner tank 22a. Disposed on opposed lower side portions of the inner tank 22a are a pair of right and left cleaning-liquid supply nozzles 25 for jetting a cleaning liquid toward the wafers W positioned in the cleaning tank 22. A chemical liquid and a deionized water can be selectively supplied via a switching valve to the cleaning-liquid supply nozzles 25 from a chemical-liquid supply source and a deionized-water supply source, which are not shown, connected to the cleaning-liquid supply nozzles 25, whereby the chemical liquid and the deionized water can be stored in the cleaning tank 22. A discharge port is formed in a bottom portion of the inner tank 22a, and a drain duct 26 provided with a discharge valve 26a is connected to the discharge port. In addition, a drain duct 27 provided with a discharge valve 27a is connected to a discharge port formed in a bottom portion of the outer tank 22b. An exhaust box 28 is located outside the outer tank 22b, and an exhaust duct 29 provided with a valve 29a is connected to an exhaust port formed in the exhaust box 28.

The cleaning tank 22 and the exhaust box 28, which are as structured above, are arranged in a tubular box 30 having a bottom. The box 30 is separated by a partition plate 31 which horizontally divides the box 30 into an upper chamber 32a in which the cleaning tank 22 is located, and a lower chamber 32b into which liquid-discharge ports of the drain ducts 26 and 27, which are respectively connected to the inner tank 22a and the outer tank 22b, and the exhaust port of the exhaust duct 29 are opened. Thus, an atmosphere of the lower chamber 32b and a discharged liquid scattering therein can be prevented from entering the upper chamber 32a, whereby the upper chamber 32a can be maintained clean. An exhaust window 33 is disposed in a sidewall of the upper chamber 32a. On the other hand, an exhaust window 34 is disposed in an upper sidewall of the lower chamber 32b, and a liquid-discharge port 35 is disposed in a lower sidewall thereof.

The drying chamber 23 includes a fixed base 37 which is communicated with an opening 22c of the cleaning tank 22 via a shutter 36, and a drying chamber body 39 that is tightly in contact with the fixed base 37 via a sealing member such as an O-ring 38. In this case, the drying chamber body 39 is made of a quartz member having an inverted U-shaped section, and the fixed base 37 is also made of a quartz member. Inside the fixed base 37 in the drying chamber 23, a pair of right and left lower gas-supply nozzles (first gas-supply nozzles) 44 and a pair of right and left upper gas-supply nozzles (second gas-supply nozzles) 42 are located along sidewalls of the fixed base 37. As shown in FIG. 3, each of the lower gas-supply nozzles 44 and each of the upper gas-supply nozzles 42 are arranged close to each other in the drying chamber 23 in an up and down direction thereof. The respective gas-supply nozzles 42 and 44 are described hereafter.

A through hole 39a is formed in a top portion of the drying chamber body 39. A rod (not shown) of the wafer board 24 slidably passes through the through hole 39a in the vertical direction (in the up and down direction in FIG. 3). A sealing mechanism is interposed between the through hole 39a and the rod, so that a hermetically sealed state of a gap between the through hole 39a and the rod can be held.

A gas discharge hole 80 for discharging a gas in the drying chamber 23 is formed in the fixed base 37 at a position below the lower gas-supply nozzles 44. A gas discharge duct 82 is connected to the gas discharge hole 80. The gas discharge duct 82 is provided with a valve 84. When the valve 84 is opened, the gas in the drying chamber 23 can be naturally discharged outside from the gas discharge hole 80 through the gas discharge duct 82. On the other hand, when the valve 84 is closed, the gas in the drying chamber 23 is prevented from being discharged outside. Opening and closing of the valve 84 is performed by the control device 60.

Each of the lower gas-supply nozzles 44 (first gas-supply nozzles) includes a pipe that is extended in the substantially horizontal direction, and a plurality of nozzle holes formed in the pipe at equal intervals therebetween. These nozzle holes are directed in the substantially horizontal direction, an obliquely downward direction descendent from the substantially horizontal direction, or a vertically downward direction. Thus, a drying gas formed of a steam of organic solvent having volatility such as IPA and $N_2$ gas can be supplied into the drying chamber 23 from the lower gas-supply nozzles 44 in the substantially horizontal direction, the obliquely downward direction descendent from the substantially horizontal direction, or the vertically downward direction.

Each of the upper gas-supply nozzles 42 (second gas-supply nozzles) includes a pipe that is extended in the substantially horizontal direction, and a plurality of nozzle holes formed in the pipe at equal intervals therebetween. These nozzle holes are directed in an obliquely upward direction ascendant from the substantially horizontal direction or a vertically upward direction. Thus, a drying gas and $N_2$ gas can be supplied into the drying chamber 23 from the upper gas-supply nozzles 42 in the obliquely upward direction ascendant from the substantially horizontal direction or the vertically upward direction.

As shown in FIG. 3, the respective lower gas-supply nozzles 44 are connected to a gas supply duct 44a, and the respective upper gas-supply nozzles 42 are connected to a gas supply duct 42a. The gas supply duct 44a and the gas supply duct 42a are merged and connected to a gas supply duct 48. A valve 44b is provided on the gas supply duct 44a and a valve 42b is provided on the gas supply duct 42a at positions in the vicinity of the merged point of the gas supply duct 44a and the gas supply duct 42a. The valves 42b and 44b are controlled by the control device 60, whereby a flow of a gas from the gas supply duct 48 to the gas supply duct 44a or the gas supply duct 42a can be switched.

As shown in FIG. 3, there are provided a supply source 50 (represented as IPA in FIG. 3) for a drying gas formed of a steam of organic solvent having volatility such as IPA, and a supply source 52 (represented as N2 in FIG. 3) for $N_2$ gas. The supply sources 50 and 52 are respectively connected to the gas supply duct 48. Supply of a drying gas from the supply source 50 to the gas supply duct 48 and supply of $N_2$ gas from the supply source 52 to the gas supply duct 48 can be adjusted by valves 50a and 52a, respectively. The respective valves 50a and 52a can be controlled by the control device 60. Thus, under the control of the control device 60, a drying gas or $N_2$ gas can be selectively sent to the respective upper gas-supply nozzles 42 and the lower gas-supply nozzles 44.

On the other hand, as shown in FIG. 3, disposed on opposed sides of the opening 22c of the cleaning tank 22 are $N_2$-gas supply nozzles 46 for jetting $N_2$ gas toward the center of the opening 22c. Each of the $N_2$-gas supply nozzles 46 includes a pipe that is extended in the substantially horizontal direction, and a plurality of nozzle holes formed in the pipe at equal intervals therebetween. These nozzle holes are directed in the substantially horizontal direction so as to jet $N_2$ gas toward the center of the opening 22c. The respective $N_2$-gas supply nozzles 46 are connected to a gas supply duct 46a, and the gas supply duct 46a is connected to the supply source 54 for $N_2$ gas. Supply of $N_2$ gas from the supply source 54 for $N_2$ gas to the gas supply duct 46a can be adjusted by a valve 54a, and the valve 54a can be controlled by the control device 60. Thus, under the control of the control device 60, $N_2$ gas can be sent to the $N_2$-gas supply nozzles 46.

The wafer board 24 can hold a plurality of, e.g., fifty wafers W in a standing state with slight gaps therebetween. The wafer board 24 can be vertically moved between the cleaning tank 22 and the drying chamber 23 by a wafer-board driving mechanism (not shown). Specifically, when the wafer board 24 is moved into the cleaning tank 22, the wafers W held by the wafer board 24 can be immersed into the cleaning liquid in the cleaning tank 22. On the other hand, when the wafer board 24 is moved into the drying chamber 23, the wafers W held by the wafer board 24 can be completely accommodated in the drying chamber 23.

The shutter 36 can be horizontally reciprocated between a closing position at which the shutter 36 closes the drying chamber 23, which is shown by the solid lines in FIG. 3, and an opening position at which the shutter 36 opens the drying chamber 23, which is shown by the two-dotted lines in FIG. 3. Such a reciprocal movement of the shutter 36 can be performed by a shutter driving mechanism 58, and the shutter driving mechanism 58 can be controlled by the control device

60. A sealing member is disposed on an upper surface of the shutter 36, whereby the drying chamber 23 can be hermetically closed by the sealing member, when the shutter 36 is located at the closing position.

Next, an operation of the cleaning and drying unit 18 as structured above will be described with reference to FIGS. 4 and 5. FIGS. 4(a) to 4(j) are views for explaining one by one operations of a series of cleaning and drying processes in the substrate processing apparatus (cleaning and drying unit 18) according to the present invention. FIG. 5 is a flowchart showing the operations of the series of cleaning and drying processes in the substrate processing apparatus (cleaning and drying unit 18) according to the present invention. The following series of cleaning processes and drying processes are performed by the control device 60 that controls the valves 42b, 44b, 50a, 52a, and 54a, the shutter driving mechanism 58, the wafer-board driving mechanism (not shown), the valve 84, and so on of the cleaning and drying unit 18.

As shown in FIG. 4(a), a cleaning liquid is supplied from the cleaning-liquid supply nozzles 25 into the cleaning tank 22, such that the cleaning liquid overflows from the upper part of the cleaning tank 22. The overflowing cleaning liquid is received by the outer tank 22b, and is discharged from the drain duct 27. The discharged cleaning liquid may be reused. At this time, the shutter 36 is located at the opening position. With the cleaning liquid being stored in the cleaning tank 22, wafers are immersed into the cleaning liquid by the wafer board 24 (Step 1 in FIG. 5). At this time, $N_2$ gas of e.g., 40° C. to 50° C. is jetted from the pair of right and left upper gas-supply nozzles in the obliquely upward direction ascendant from the substantially horizontal direction or the vertically upward direction. Thus, the insides of the drying chamber 23 and the drying chamber body 39 are heated, so that liquid pool in the drying chamber 23 can be eliminated (Step 2 in FIG. 5). At this time, the valve 84 provided on the gas discharge duct 82 is opened, whereby the $N_2$ gas supplied from the upper gas-supply nozzles 42 into the drying chamber 23 is naturally discharged outside from the gas discharge hole 80 through the gas discharge duct 82.

Meanwhile, $N_2$ gas is jetted from the pair of right and left $N_2$-gas supply nozzles 46 toward the center of the opening 22c of the cleaning tank 22. Thus, it is possible to prevent that a steam, which is generated by the evaporated cleaning liquid in the cleaning tank 22, comes into contact with the inner surface of the drying chamber body 39, to thereby form droplets on the inner surface of the drying chamber body 39.

Figure 4:
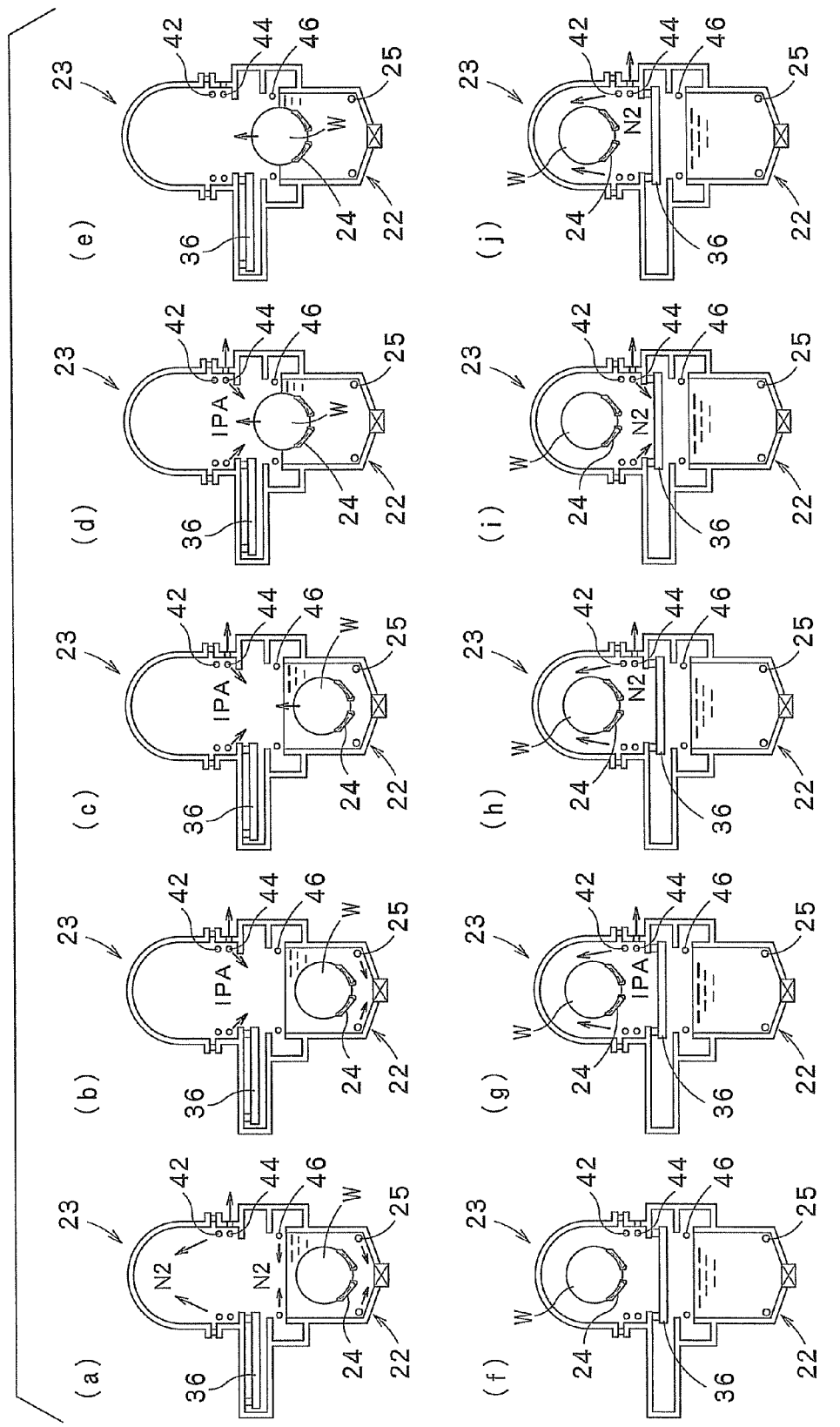
FIGS. 4(a) to 4(j) are views for explaining one by one operations of a series of cleaning and drying processes in the substrate processing apparatus according to the present invention.
Figure 5:
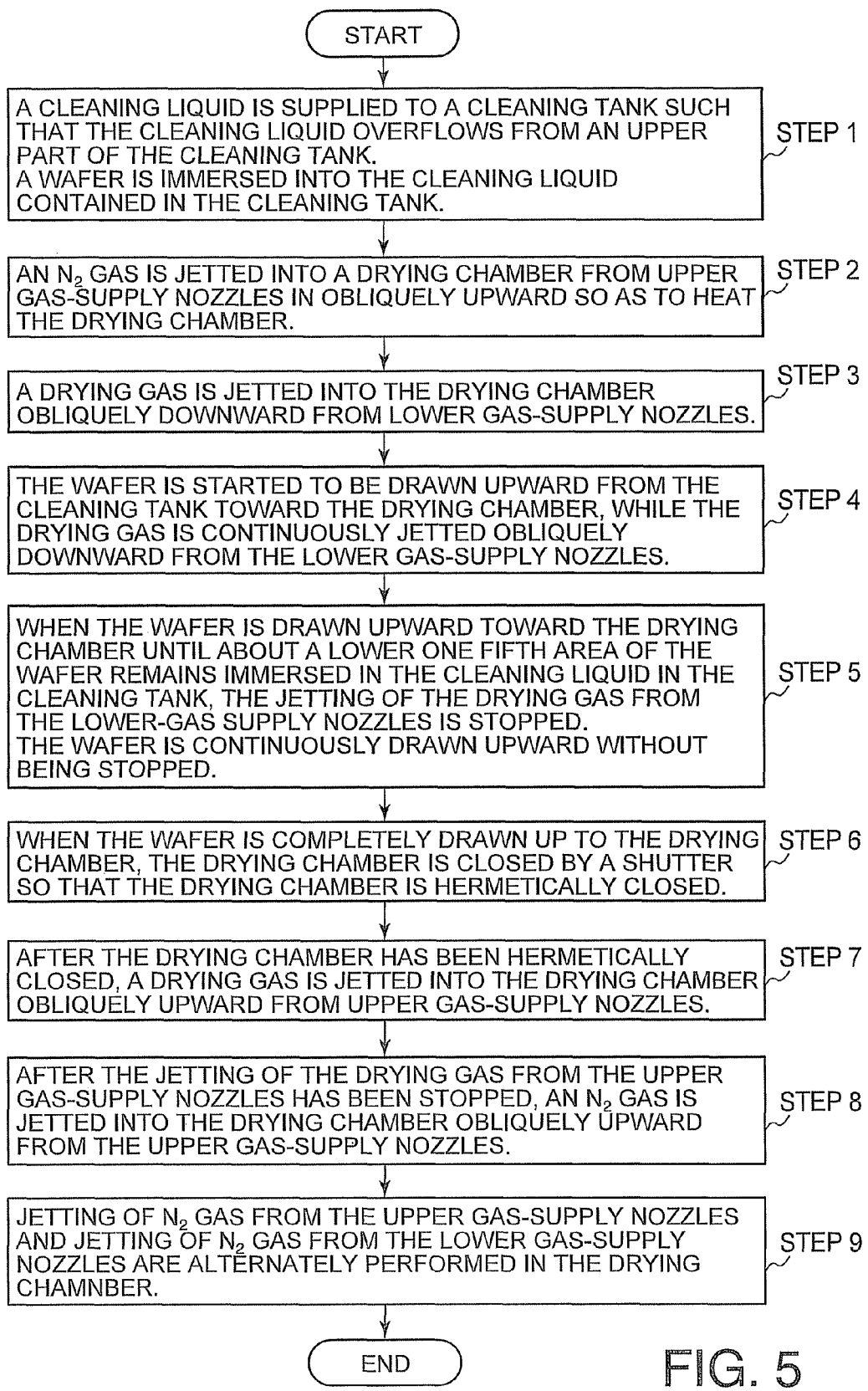
FIG. 5 is a flowchart showing the operations of the series of cleaning and drying processes in the substrate processing apparatus according to the present invention.

Then, as shown in FIG. 4(b), the jetting of the $N_2$ gas from the pair of right and left upper gas-supply nozzles 42 into the drying chamber 23 is stopped. In place thereof, a drying gas (represented as IPA in FIG. 4) of 70° C. to 80° C. is jetted from the pair of right and left lower gas-supply nozzles 44 into the drying chamber 23 in the substantially horizontal direction, the obliquely downward direction descendent from the substantially horizontal direction, or the vertically downward direction (Step 3 in FIG. 5). FIGS. 4 and 5 illustrate that the drying gas is jetted obliquely downward, which is by way of example. At this time, the jetting of the $N_2$ gas from the pair of $N_2$-gas supply nozzles 46 is stopped. Thus, the drying chamber 23 is filled with the drying-gas atmosphere, and a liquid film of the drying gas is formed on the cleaning liquid stored in the cleaning tank 22. Also at this time, the valve 84 provided on the gas discharge duct 82 is continuously opened, whereby the drying gas supplied from the lower gas-supply nozzles 44 into the drying chamber 23 is naturally discharged outside from the gas discharge hole 80 through the gas discharge duct 82.

Then, as shown in FIG. 4(c), while the lower gas-supply nozzles 44 continue to supply the drying gas into the drying chamber 23 in the substantially horizontal direction, the obliquely downward direction descendent from the substantially horizontal direction, or the vertically downward direction, the wafers W are started to be drawn upward by the wafer board 24 from the cleaning tank 22 toward the drying chamber 23 (Step 4 in FIG. 5). When the wafers W pass through the liquid level of the cleaning liquid stored in the cleaning tank 22, the wafers W also pass the liquid film of the drying gas formed on the cleaning liquid. Thus, the liquid film of the drying gas can be adhered to the surfaces of the wafers W.

Then, as shown in FIG. 4(d), in the course of the wafers W being moved by the wafer board 24 toward the drying chamber 23, a part (upper part) of each wafer W is exposed upward from the liquid level of the cleaning liquid in the cleaning tank 22, while the other part (lower part) of the wafer W remains immersed in the cleaning liquid in the cleaning tank 22. At this time, as shown in FIG. 4(e), the jetting of the drying gas from the lower-gas supply nozzles 44 into the drying chamber 23 is stopped. Specifically, the wafer W is drawn upward by the wafer board 24 toward the drying chamber, until about a lower one fifth area of the wafer W remains immersed in the cleaning liquid in the cleaning tank 22. At this time, the jetting of the drying gas from the lower gas-supply nozzles 44 is stopped.

In addition, when the jetting of the drying gas from the lower gas-supply nozzles 44 into the drying chamber 23 is stopped, the valve 84 provided on the gas discharge duct 84 is closed. Thus, the drying gas contained in the drying chamber is prevented from being discharged outside.

Thereafter, the wafers W are continuously drown upward by the wafer board 24 without being stopped (Step 5 in FIG. 5).

While the wafers W are moved by the wafer board 24 from the cleaning tank 22 into the drying chamber 23, i.e., while the wafers W are moved from the condition as shown in FIG. 4(c) to the condition as shown in FIG. 4(f), a transfer speed at which the wafers W are moved from a condition where the wafers W are just completely exposed from the cleaning liquid stored in the cleaning tank 22 to a condition where the movement of the wafers W into the drying chamber 23 is finished (see, FIG. 4(f)), is greater than a transfer speed at which the wafers W are moved from a condition where the wafers W are accommodated in the cleaning tank 22 (see, FIG. 4(c)) to the condition where the wafers W are just completely exposed from the cleaning liquid stored in the cleaning tank 22. To be specific, the transfer speed at which the wafers W are moved from the condition where the wafers W are accommodated in the cleaning tank 22 to the condition where the wafers W are just completely exposed from the cleaning liquid in the cleaning tank 22 is 60 mm per second. On the other hand, the transfer speed at which the wafers W are moved from the condition where the wafer W are just completely exposed from the cleaning liquid in the cleaning tank 22 to the condition where the movement of the wafers W into the drying chamber 23 is finished is 200 mm per second.

Then, as shown in FIG. 4(f), after the wafers W have been completely drawn up into the drying chamber 23, the shutter 36 is driven by the shutter driving mechanism, so that the shutter 36 is moved from the opening position to the closing position. Thus, the drying chamber 23 is hermetically closed by the shutter 36 (Step 6 in FIG. 5).

As shown in FIG. 4(g), after the wafers W have been accommodated in the drying chamber 23 and the drying chamber 23 has been hermetically closed, the drying gas is jetted into the drying chamber 23 from the upper gas-supply nozzles 42 in the obliquely upward direction ascendant from the substantially horizontal direction or the vertically upward direction (Step 7 in FIG. 5). FIGS. 4 and 5 illustrate that the drying gas is jetted obliquely upward, which is by way of example. Thus, the drying gas supplied from the upper gas-supply nozzles 42 into the drying chamber 23 once abuts on the upper wall (ceiling wall) of the drying chamber body 39, and then uniformly flows downward. As a result, the steam of the drying gas can uniformly condense on or adsorb on the surfaces of the wafer W. When the drying gas is jetted into the drying chamber 23 from the upper gas-supply nozzles 42 in the obliquely upward direction ascendant from the substantially horizontal direction or the vertically upward direction, the valve 84 provided on the gas discharge duct 82 is again opened. Thus, the drying gas supplied from the upper gas-supply nozzles 42 into the drying chamber 23 is naturally discharged outside from the gas discharge hole 80 through the gas discharge duct 82.

Then, as shown in FIG. 4(h), the jetting of the drying gas from the upper gas-supply nozzles 42 is stopped. Thereafter, in place thereof, $N_2$ gas is jetted from the upper gas-supply nozzles 42 in the obliquely upward direction ascendant from the substantially horizontal direction or the vertically upward direction (Step 8 in FIG. 5). Thus, the steam of the drying gas condensing on or adsorbing on the surfaces of the wafers W is removed, whereby the surfaces of the wafers W can be uniformly dried. Also at this time, the valve 84 provided on the gas discharge duct 82 is continuously opened so that the $N_2$ gas supplied from the upper gas-supply nozzles 42 into the drying chamber 23 is naturally discharged outside from the gas discharge hole 80 through the gas discharge duct 82.

Thereafter, as shown in FIG. 4(i), the jetting of the $N_2$ gas from the upper gas-supply nozzles 42 is stopped. In place thereof, $N_2$ gas is jetted from the lower gas-supply nozzles 44 in the obliquely downward direction descendent from the substantially horizontal direction. After a certain time period has elapsed, as shown in FIG. 4(j), the jetting of the $N_2$ gas from the lower gas-supply nozzles 44 is stopped, and in place thereof, $N_2$ gas is jetted again from the upper gas-supply nozzles 42 in the obliquely upward direction ascendant from the substantially horizontal direction. In this manner, the jetting of the $N_2$ gas as shown in FIG. 4(i) and the jetting of the $N_2$ gas as shown in FIG. 4(j) are alternately performed so as to continuously dry the surfaces of the wafer W, while the drying-gas atmosphere in the drying chamber 23 is replaced with the $N_2$ gas atmosphere, with the inside of the drying chamber 23 being heated by the $N_2$ gas (Step 9 in FIG. 5).

After that, the supply of the $N_2$ gas from both the upper gas-supply nozzles 42 and the lower gas-supply nozzles 44 is stopped, and the series of cleaning processes and the drying processes are finished.

As described above, according to the substrate processing apparatus (cleaning and drying unit 18) and the substrate processing method in this embodiment, the wafers W are moved from the cleaning tank 22 into the drying chamber 23, with the drying gas having been already supplied into the drying chamber 23. Thus, it is possible to reduce a time period between a timing when the drawing-up of the wafers W from the cleaning liquid in the cleaning tank 22 is started to a timing when the drying gas is supplied onto the surfaces of the wafers W. Therefore, it is possible to uniformly and promptly dry the surfaces of the wafers W, and to restrain formation of watermarks on the surfaces of the wafers W by droplets of the cleaning liquid adhering to the surfaces of the wafers W.

In addition, when the wafers W are drawn up from the cleaning liquid in the cleaning tank 22, since the drying gas is jetted in the substantially horizontal direction, the obliquely downward direction descendent from the substantially horizontal direction, or the vertically downward direction, the liquid film of the drying gas can be formed on the cleaning liquid in the cleaning tank 22. Thus, when the wafers W are drawn up from the cleaning tank 22, the liquid film of the drying gas can be adhered to the surfaces of the wafers W. In addition, since the drying gas is supplied in the substantially horizontal direction, the obliquely downward direction descendent from the substantially horizontal direction, or the vertically downward direction, there is no possibility that the drying gas of relatively a high temperature is directly blown onto the upper wall constituting the drying chamber body 39 of the drying chamber 23, whereby water condensation on the upper wall of the drying chamber 23, which might be caused by such a drying gas, can be prevented.

Further, in the cause of the wafers W being drawn up toward the drying chamber 23, the supply of the drying gas into the drying chamber 23 is stopped, under the condition where a part of each wafer W remains immersed in the cleaning liquid stored in the cleaning tank 22. Namely, it is not necessary to supply the drying gas throughout the overall step during when the wafers W are moved from the cleaning tank 22 into the drying chamber 23. That is, even when the supply of the drying gas is stopped under the condition where a part of each wafer W is exposed from the cleaning liquid in the cleaning tank 22, the drying gas can pervade the whole surface of each wafer W due to a diffusion property of the drying gas. As a result, an amount of the drying gas used therefor can be saved.

Furthermore, after the wafers W have been moved into the drying chamber 23, the drying gas is supplied into the drying chamber 23 in the obliquely upward direction ascendant from the substantially horizontal direction or the vertically upward direction. Thus, the drying gas once abuts on the upper wall or the like constituting the drying chamber 23, and uniformly flows downward. As a result, the steam of the drying gas can uniformly condense on or adsorb on the surfaces of the wafers W, whereby the moisture on the overall surfaces of the wafers W can be uniformly removed so as to be dried.

In addition, when the drying gas is supplied into the drying chamber 23 from the upper gas-supply nozzles 42 in the obliquely upward direction ascendant from the substantially horizontal direction or the vertically upward direction after the wafers W have been moved into the drying chamber 23, the drying chamber 23 is hermetically closed. Thus, the steam of the drying gas supplied into the drying chamber 23 can effectively condense on or adsorb on the surfaces of the wafers W.

In addition, when the wafers W are moved from the cleaning tank 22 into the drying chamber 23, while the drying gas is supplied into the drying chamber 23, the wafers W can be continuously moved from the cleaning tank 22 into the drying chamber without being stopped. According to such a substrate processing method, the wafers W can be promptly moved from the cleaning tank 22 into the drying chamber 23.

In addition, when the jetting of the drying gas from the lower gas-supply nozzles 44 into the drying chamber 23 is stopped, the valve 84 provided on the gas discharge duct 82 is closed, the drying gas contained in the drying chamber 23 can be prevented from being discharged outside. Thus, since lowering of concentration of the drying gas in the drying chamber 23 can be prevented without any disturbance of the drying gas atmosphere in the drying chamber 23, the atmosphere of the drying gas can be uniformly maintained. Therefore, even while the jetting of the drying gas from the lower gas-supply nozzles 44 into the drying chamber 23 is stopped, it is possible to more promptly dry the wafers W, as well as it is possible to restrain the formation of watermarks on the surfaces of the wafers W.

In addition, when the wafers W are moved by the wafer board 24 from the cleaning tank 22 into the drying chamber 23, a transfer speed at which the wafers W are moved from the condition where the wafers W are just completely exposed from the cleaning liquid stored in the cleaning tank 22 to the condition where the movement of the wafers W into the drying chamber 23 is finished (see, FIG. 4(f)), is greater than a transfer speed at which the wafers W are moved from the condition where the wafers W are accommodated in the cleaning tank 22 (see, FIG. 4(c)) to the condition where the wafers W are just completely exposed from the cleaning liquid stored in the cleaning tank 22. Herein, in order to prevent formation of watermarks on the wafers W when the wafers W are taken upward from the cleaning liquid stored in the cleaning tank 22, it is necessary to somewhat slower the transfer speed of the wafers W. However, after the wafers W have been completely exposed from the cleaning liquid stored in the cleaning tank 22, it is preferable to move the wafers W at a higher speed up to the predetermined position in the drying chamber 23 which is shown in FIG. 4(f), with a view to reducing a time period.

The substrate processing apparatus (cleaning and drying unit 18) and the substrate processing method according to the present invention are not limited to the above embodiment, and various modifications are possible. For example, although the substrate processing apparatus according to the present invention is applied to a cleaning system for semiconductor wafers, the substrate processing apparatus can be applied to a processing system other than a cleaning system. Moreover, in addition to the system for semiconductor wafers, the present invention can be applied to a system for LCD glass substrates.

Figure 6:
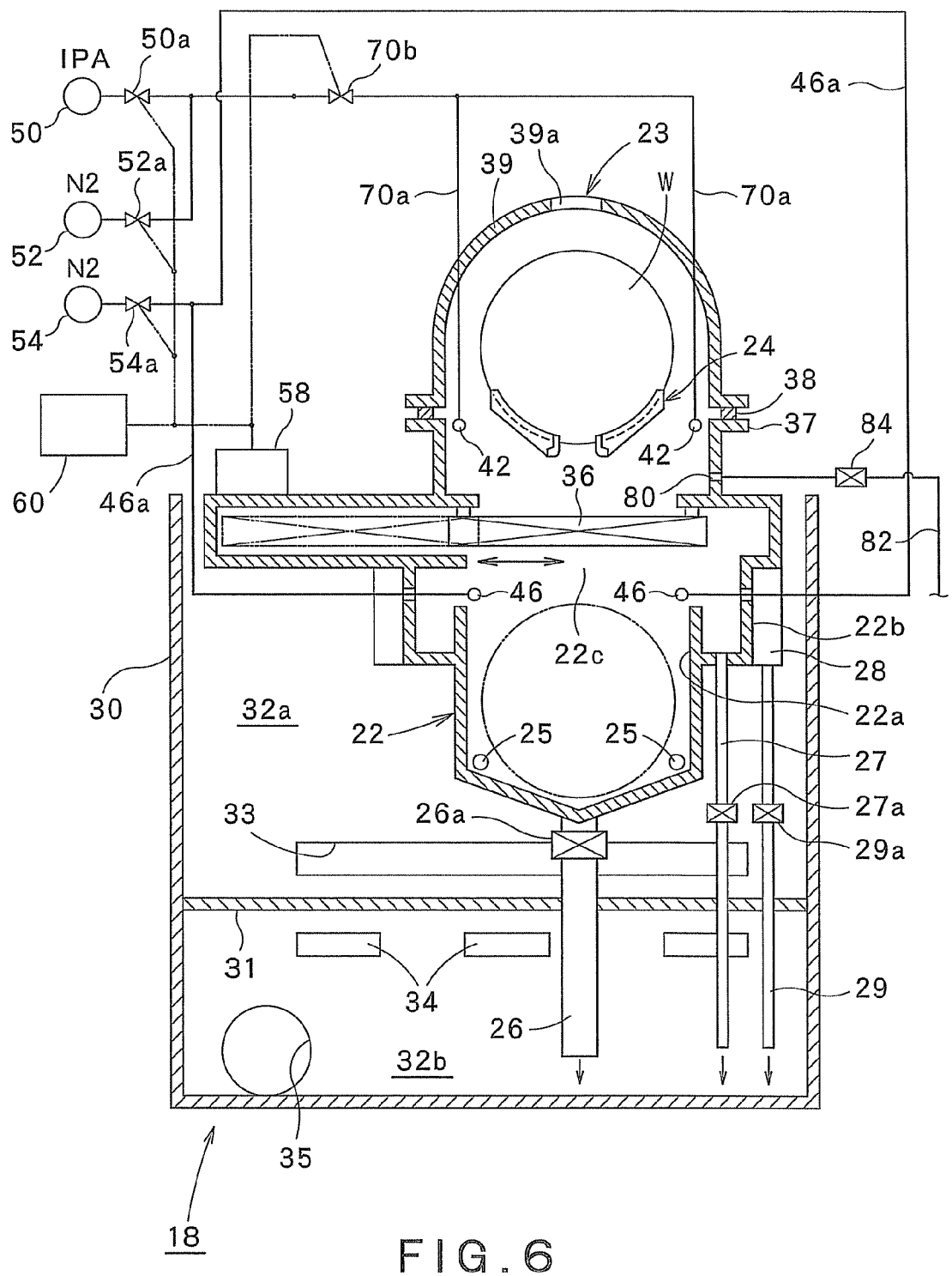
FIG. 6 is a sectional view of another substrate processing apparatus according to the present invention.
Figure 7:
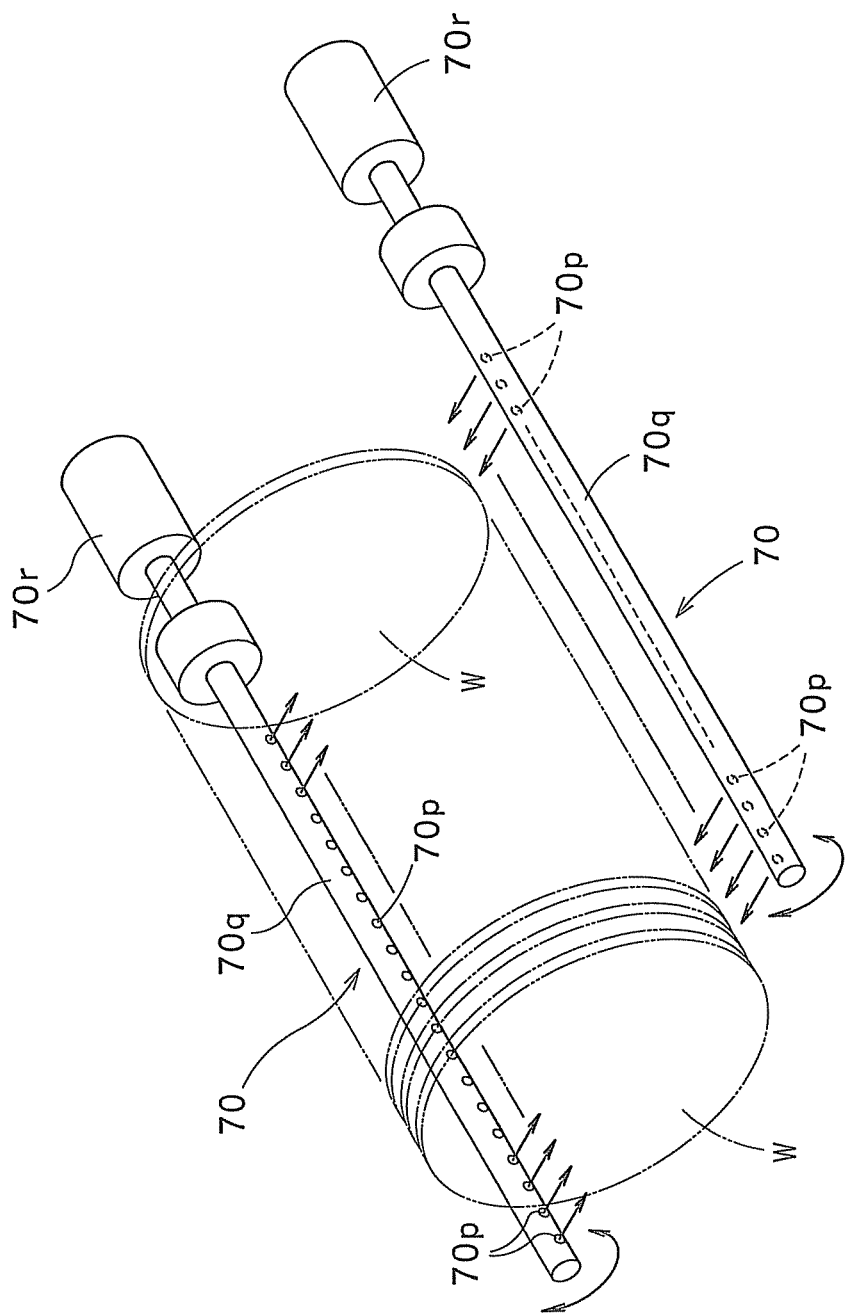
FIG. 7 is a perspective view showing a structure of a gas supply nozzle of the another substrate processing apparatus according to the present invention.

FIG. 3 shows the two types of nozzles having different gas jetting directions (the upper gas-supply nozzles 42 and the lower gas-supply nozzles 44) as gas supply nozzles for supplying a drying gas into the drying chamber 23. However, not limited thereto, there may be provided a pair of right and left gas supply nozzles. Such a modification is described with reference to FIGS. 6 and 7. FIG. 6 is a sectional view of another substrate processing apparatus according to the present invention. FIG. 7 is a perspective view showing a structure of a gas supply nozzle of the other substrate processing apparatus according to the present invention.

As shown in FIG. 6, inside the fixed base 37 of the drying chamber 23, a pair of right and left gas supply nozzles 70 are disposed along sidewalls of the fixed base 37. As shown in FIG. 7, each of the gas supply nozzles 70 includes a pipe 70q that is extended in the substantially horizontal direction, and a plurality of nozzle holes 70p formed in the pipe 70q at equal intervals therebetween. In such a gas supply nozzle 70, a gas can be jetted from the inside of the pipe 70q to the outside of the pipe 70q via the nozzle holes 70p. A motor 70r is disposed on one end of the pipe 70q of each gas supply nozzle 70. As shown by the arrows in FIG. 7, the pipes 70q can be driven and rotated clockwise and counterclockwise by the motors 70r. Due to the motor 70r capable of driving and rotating the pipe 70q in both the normal and reverse directions, the directions of the nozzle holes 70p can be varied, whereby a direction of a gas jetted from the gas supply nozzle 70 can be freely varied. Each motor 70r can be controlled by the control device 60.

As shown in FIG. 6, the gas supply nozzles 70 are connected to a gas supply duct 70a, and a gas can be supplied from the gas supply duct 70a to the pipes 70q. On the other hand, as shown in FIG. 6, there are provided the supply source 50 (represented as IPA in FIG. 6) for a drying gas formed of a steam of organic solvent having volatility such as IPA, and the supply source 52 (represented as N2 in FIG. 6) for N$_2$ gas. The supply sources 50 and 52 are respectively connected to the gas supply duct 70a via a valve 70b. Supply of a drying gas from the supply source 50 to the gas supply duct 70a and supply of N$_2$ gas from the supply source 52 to the gas supply duct 70a can be adjusted by valves 50a and 52a. The valves 50a, 52a, and 70b can be controlled by the control device 60, respectively. Thus, under the control of the control device 60, a drying gas or N$_2$ gas can be selectively sent to the respective gas supply nozzles 70.

Due to the provision of the gas supply nozzles 70 as shown in FIGS. 6 and 7, under the condition where the wafers W are immersed in the cleaning liquid stored in the cleaning tank 22, the gas supply nozzles 70 can jet a drying gas into the drying chamber 23 in the substantially horizontal direction, the obliquely downward direction descendent from the substantially horizontal direction, or the vertically downward direction, in the steps shown in FIGS. 4(b) to 4(d), by the motors 70r which can orient the directions of the nozzles holes 70p formed in the respective pipes 70q into the substantially horizontal direction, the obliquely downward direction descendent from the substantially horizontal direction, or the vertically downward direction. After the wafers W have been moved into the drying chamber 23, the motors 70r vary the orientation of the direction of the nozzle holes 70p formed in the respective pipes 70q into the obliquely upward direction ascendant from the substantially horizontal direction or the vertically upward direction. Thus, the gas supply nozzles 70 can jet a drying gas into the drying chamber 23 in the obliquely upward direction ascendant from the substantially horizontal direction or the vertically upward direction, in the step as shown in FIG. 4(g).

Figure 8:
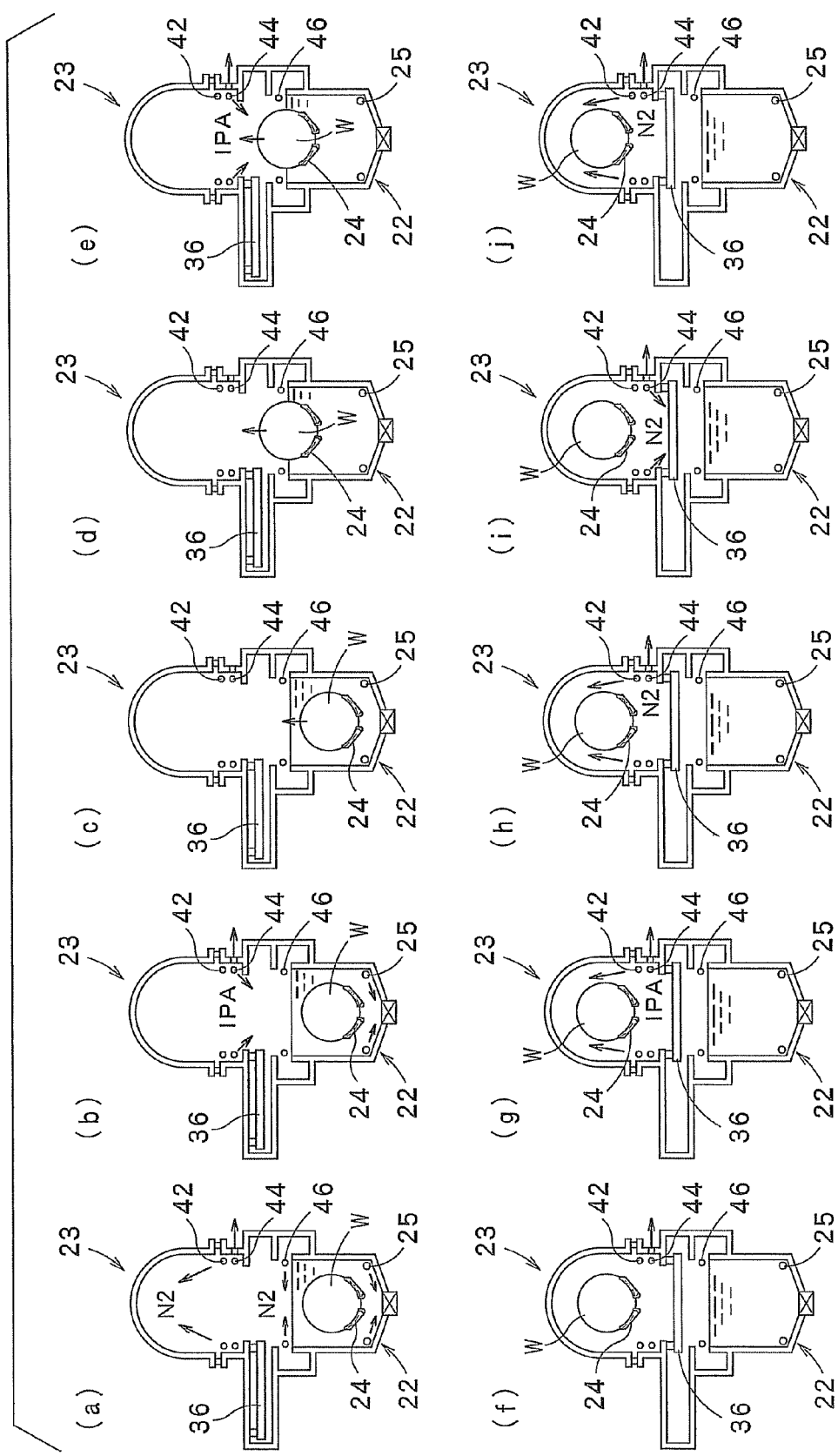
FIGS. 8(a) to 8(j) are views for explaining one by one operations of other series of cleaning and drying processes in the substrate processing apparatus according to the present invention.
Figure 9:
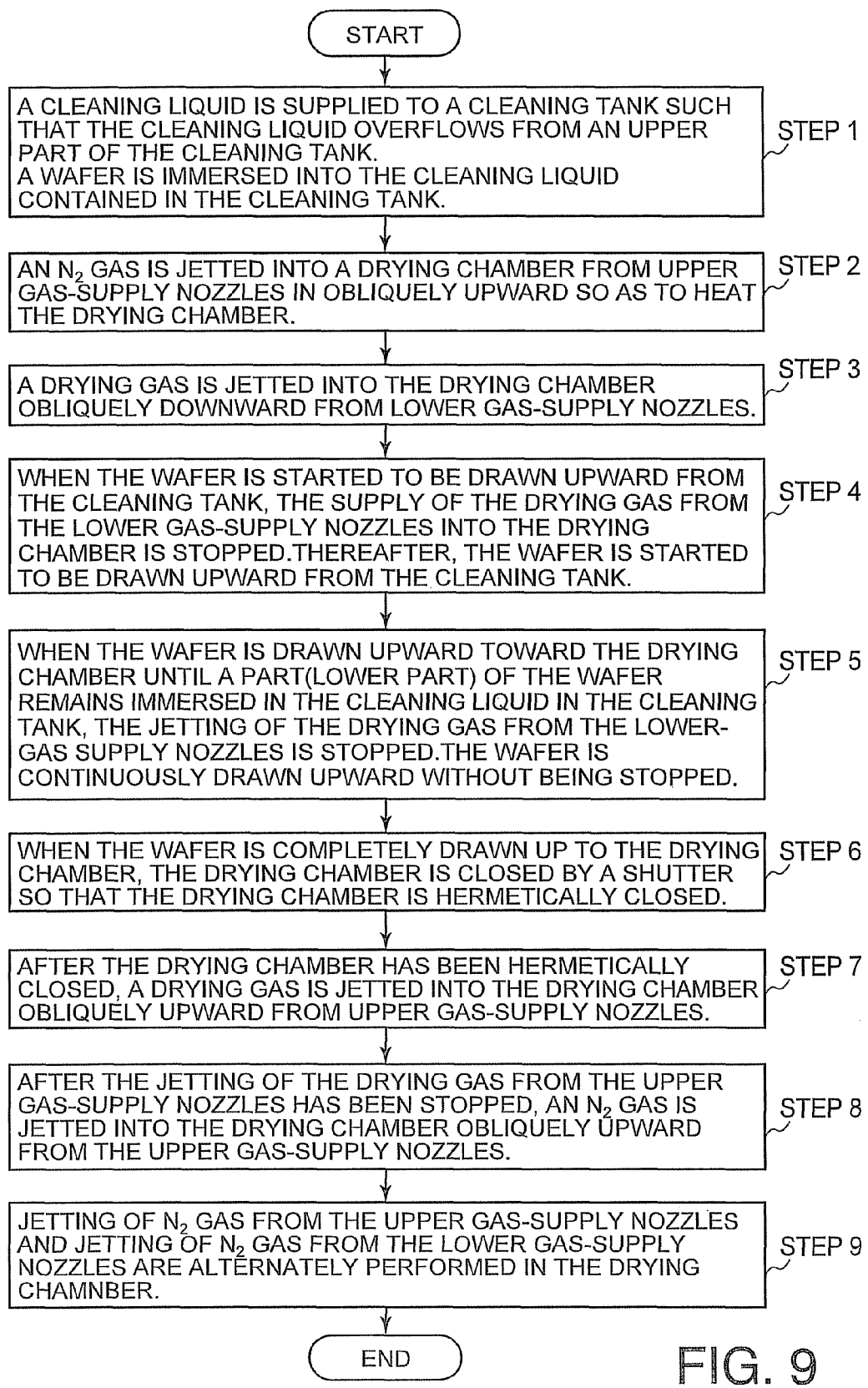
FIG. 9 is a flowchart showing the operations of the other series of cleaning and drying processes of the substrate processing apparatus according to the present invention.

The drying method for the wafers W is not limited to the method shown in FIGS. 4 and 5. Namely, it is not limited to the following case. That is, the wafers W are moved from the cleaning tank 22 into the drying camber 23 while the drying gas is supplied into the drying chamber 23. At this time, the supply of the drying gas into the drying chamber 23 is stopped under the condition where a part of each wafer W remains immersed in the cleaning liquid stored in the cleaning tank 22. Then, the drying gas is again supplied into the drying chamber 23, after the wafers W have been moved into the drying chamber 23. However, instead of the aforementioned method, the following method is possible. Namely, the supply of the drying gas into the drying chamber 23 is stopped before the wafers W are moved from the cleaning tank 22 into the drying chamber 23, and thereafter the wafers W are moved from the cleaning tank 22 into the drying chamber 23. At this time, the supply of the drying gas into the drying chamber 23 is started again, under the condition where a part of each wafer W remains immersed in the cleaning liquid in the cleaning tank. Such a modification is described with reference to FIGS. 8 and 9. FIGS. 8(a) to 8(j) are views for explaining one by one other series of cleaning and drying processes in the substrate processing apparatus according to the present invention. FIG. 9 is a flowchart showing operations of other series of cleaning and drying processes of the substrate processing apparatus according to the present invention. The series of cleaning processes and the drying processes shown in FIGS. 8 and 9 are performed by the control device 60 that controls the valves 42b, 44b, 50a, 52a, and 54a, the shutter driving mechanism 58, the wafer-board driving mechanism (not shown), and so on of the cleaning and drying unit 18.

Since operations of FIGS. 8(a) and 8(b) (corresponding to Steps 1 to 3 in FIG. 9) are substantially the same as those operations shown in FIGS. 4(a) and 4(b) (corresponding to Steps 1 to 3 in FIG. 5), detailed description thereof is omitted.

As shown in FIG. 8(c), when the wafers W are drawn upward by the wafer board 24 from the cleaning tank 22 toward the drying camber 23, the supply of the drying gas from the lower gas-supply nozzles 44 into the drying chamber 23 is stopped. At this time, at the time when the jetting of the drying gas from the lower gas-supply nozzles 44 into the drying chamber 23 is stopped, the valve 84 provided on the gas discharge duct 82 is closed. Thus, the drying gas contained in the drying chamber 23 is prevented from being discharged outside.

Then, under a condition where no drying gas is supplied into the drying chamber 23, the wafers W are drawn upward by the wafer board 24 from the cleaning tank 22 toward the drying chamber 23 (Step 4 in FIG. 9).

Then, as shown in FIG. 8(d), in the course of the wafers W being moved by the wafer board 24 toward the drying chamber 23, a part (upper part) of each wafer W is exposed upward from the liquid level of the cleaning liquid in the cleaning tank 22, while the other part (lower part) of the wafer W remains immersed in the cleaning liquid in the cleaning tank 22. At this time, as shown in FIG. 8(e), the jetting of the drying gas from the lower gas-supply nozzles 44 into the drying chamber 23 is restarted. When the jetting of the drying gas from the lower gas-supply nozzles 44 into the drying chamber 23 is restarted, the valve 84 provided on the gas discharge duct 82 is again opened. Thus, the drying gas supplied from the lower gas-supply nozzles 44 into the drying chamber 23 is naturally discharged outside from the gas discharge hole 80 through the gas discharge duct 82.

Thereafter, while the drying gas is continued to be supplied from the lower gas-supply nozzles 44 into the drying chamber 23, the wafers W can be continuously drawn upward by the wafer board 24 without being stopped (Step 5 in FIG. 8).

Since the succeeding operations shown in FIGS. 8(f) to 8(j) (corresponding to Steps 6 to 9 in FIG. 9) are substantially the same as those operations shown in FIGS. 4(f) to 4(j) (corresponding to Steps 6 to 9 in FIG. 5), detailed description thereof is omitted.

According to the drying method shown in FIGS. 8 and 9, the drying gas is firstly supplied into the drying chamber 23, and the supply of the drying gas into the drying chamber 23 is stopped before the wafers W are drawn up from the cleaning tank 22 toward the drying chamber 23. Thus, before the wafers W are moved into the drying chamber 23, the drying chamber 23 has been already filled with the drying gas atmosphere, and the liquid film of the drying gas has been formed on the cleaning liquid in the cleaning tank 22. Therefore, it is possible to reduce a time period between a timing when the drawing-up of the wafers W from the cleaning liquid in the cleaning tank 22 is started and a timing when the drying gas is supplied onto the surfaces of the wafers W. Thus, it is possible to uniformly and promptly dry the surfaces of the wafers W, and to restrain formation of watermarks on the surfaces of the wafers W by droplets of the cleaning liquid adhering to the surfaces of the wafers W.

In addition, when the wafers W are drawn up from the cleaning liquid in the cleaning tank 22, since the drying gas is supplied in the substantially horizontal direction, the obliquely downward direction descendent from the substantially horizontal direction, or the vertically downward direction, the liquid film of the drying gas, which has been as described above, can be formed on the cleaning liquid in the cleaning tank 22.

Herein, when the wafers W are drawn up toward the drying chamber 23, the supply of the drying gas is stopped, and the supply of the drying gas into the drying chamber 23 is restarted under the condition where a part of each wafer remains immersed in the cleaning liquid stored in the cleaning tank 22. Namely, it is not necessary to supply the drying gas throughout the overall step during when the wafers W are moved from the cleaning tank 22 into the drying chamber 23. That is, even when the supply of the drying gas is restarted under the condition where a part of each wafer W is taken out from the cleaning liquid in the cleaning tank 22, the drying chamber 23 has been already filled with the drying gas atmosphere and the liquid film of the drying gas has been formed on the cleaning liquid in the cleaning tank 22. Therefore, the drying gas can pervade substantially the whole surface of each wafer W due to a diffusion property of the drying gas. As a result, an amount of the drying gas used therefor can be saved.

It can be considered that the liquid film of the drying gas might run short in the cause of drawing up the wafers W from the cleaning liquid in the cleaning tank 22, because all the liquid film of the drying gas formed on the cleaning liquid in the cleaning tank 22 has adhered to the wafers W. However, since the supply of the drying gas into the drying chamber 23 is restarted during the drawing-up operation of the wafers W, there is no possibility that an amount of the drying gas to be supplied to the wafers W might run short.

As a further modification, as shown in FIG. 4(g), when the drying gas is jetted into the drying chamber 23 from the upper gas-supply nozzles 42 in the obliquely upward direction ascendant from the substantially horizontal direction or the vertically upward direction, the shutter 36 may not fully close the drying chamber 23. That is, since it takes time for the shutter 36 to be moved from the opening position to the closing position, after the wafers W have been received in the drying chamber 23 by the wafer board 24, the movement of the shutter 36 from the opening position to the closing position may be started, simultaneously with the drying gas being jetted from the upper gas-supply nozzles 42 in the obliquely upward direction ascendant from the substantially horizontal direction or the vertically upward direction. In this case, although the drying chamber 23 is not hermetically closed in a perfect manner after several seconds from a time point when the shutter 36 starts to be moved from the opening position to the closing position, the wafers W can be dried without any problem. Moreover, in this case, a time period required for drying the wafers W can be reduced.

The invention claimed is:

1. A substrate processing apparatus comprising:
a cleaning tank configured to store a cleaning liquid for a substrate to be processed;
a drying chamber disposed above the cleaning tank, the drying chamber including a gas supply part therein, the gas supply part being configured to supply a drying gas;
a holding part configured to hold a substrate to be processed and to move the substrate to be processed between the cleaning tank and the drying chamber; and
a control device configured to control the gas supply part and the holding part in such a manner that a substrate to be processed is firstly immersed into the cleaning liquid stored in the cleaning tank, that a drying gas is then supplied into the drying chamber from the gas supply part only in an obliquely downward direction descendent from a substantially horizontal direction, or a vertically downward direction, and that the substrate to be processed is moved upward by the holding part from the cleaning tank into the drying chamber with the drying gas being supplied into the drying chamber from the gas supply part, and in such a manner that, during this upward movement of the substrate to be processed from the cleaning tank into the drying chamber, after starting this upward movement the supply of the drying gas into the drying chamber is stopped, under a condition where a part of the substrate to be processed is immersed in the cleaning liquid in the cleaning tank and the rest of the substrate to be processed is exposed outside the cleaning liquid, and that a drying gas is supplied into the drying chamber in an obliquely upward direction ascendant from the substantially horizontal direction or a vertically upward direction, after the movement of the substrate to be processed into the drying chamber has been finished.

2. The substrate processing apparatus according to claim 1, wherein the gas supply part is configured to freely vary a direction in which the drying gas is supplied.

3. The substrate processing apparatus according to claim 2, wherein
the gas supply part includes a cylindrical member that is extended in the substantially horizontal direction, a plurality of holes formed in the cylindrical member, and a rotational driving mechanism configured to rotate and drive the cylindrical member,
the drying gas is supplied from an inside of the cylindrical member to an outside of the cylindrical member through the holes, and
the rotational driving mechanism rotates and drives the cylindrical member such that a direction in which the drying gas is supplied can be freely varied.

4. The substrate processing apparatus according to claim 1, wherein:
the gas supply part is composed of a first gas-supply portion configured to supply the drying gas in the obliquely downward direction descendent from the substantially horizontal direction, or the vertically downward direction, and a second gas-supply portion configured to supply the drying gas in the obliquely upward direction ascendant from the substantially horizontal direction or the vertically upward direction, and
the first gas-supply portion is configured to supply the drying gas into the drying chamber in the obliquely downward direction descendent from the substantially horizontal direction, or the vertically downward direction, under a condition where the substrate to be processed is immersed in the cleaning liquid in the cleaning tank, and the second gas-supply portion is configured to supply the drying gas in the obliquely upward direction ascendant from the substantially horizontal direction or the vertically upward direction, after the movement of the substrate to be processed into the drying chamber has been finished.

5. The substrate processing apparatus according to claim 4, wherein the first gas-supply portion is configured to supply the drying gas into the drying chamber in the vertically downward direction.

6. The substrate processing apparatus according to claim 4, wherein
the first gas-supply portion and the second gas-supply portion are arranged vertically spaced from each other with the second gas-supply portion positioned above the first gas-supply portion.

7. The substrate processing apparatus according to claim 1, wherein the drying chamber is hermetically closed, when the drying gas is supplied into the drying chamber from the gas supply part in the obliquely upward direction ascendant from the substantially horizontal direction or the vertically upward direction after the movement of the substrate to be processed into the drying chamber has been finished.

8. The substrate processing apparatus according to claim 1, wherein
there is provided a gas discharge part configured to selectively discharge the drying gas from the drying chamber, and
the control device controls the gas discharge part in such a manner that, when the drying gas is supplied from the gas supply part into the drying chamber, the drying gas is discharged by the gas discharge part from the drying chamber, and that, when the supply of the drying gas into the drying chamber is stopped, the discharge of the drying gas by the gas discharge part from the drying chamber is stopped.

9. The substrate processing apparatus according to claim 1, wherein the control device controls the holding part in such a manner that, when the holding part moves the substrate to be processed from the cleaning tank into the drying chamber, a transfer speed at which the substrate to be processed is moved from a condition where the substrate to be processed is just completely exposed from the cleaning liquid stored in the cleaning tank to a condition where the movement of the substrate to be processed into the drying chamber is finished, is greater than a transfer speed at which the substrate to be processed is moved from a condition where the substrate to be processed is accommodated in the cleaning tank to the condition where the substrate to be processed is just completely exposed from the cleaning liquid stored in the cleaning tank.

10. The substrate processing apparatus according to claim 1, wherein the drying gas is formed of a steam of organic solvent.

11. A substrate processing method for a substrate to be processed, with the use of a substrate processing apparatus comprising a cleaning tank configured to store a cleaning liquid for a substrate to be processed and a drying chamber disposed above the cleaning tank, the substrate processing method comprising:
immersing a substrate to be processed into the cleaning liquid stored in the cleaning tank;
supplying a drying gas into the drying chamber only in an obliquely downward direction descendent from the substantially horizontal direction, or a vertically downward direction;
moving upward the substrate to be processed from the cleaning tank into the drying chamber with the drying gas being supplied into the drying chamber, and, during this upward movement of the substrate to be processed from the cleaning tank into the drying chamber, after starting this upward movement stopping the supply of the drying gas into the drying chamber under a condition where a part of the substrate to be processed is immersed in the cleaning liquid in the cleaning tank and the rest of the substrate to be processed is exposed outside the cleaning liquid; and
restarting the supply of drying gas into the drying chamber in an obliquely upward direction ascendant from the substantially horizontal direction or a vertically upward direction, after the movement of the substrate to be processed into the drying chamber has been finished.

12. The substrate processing method according to claim 11, wherein the drying gas is supplied into the drying chamber in the substantially horizontal direction, under the condition where the substrate to be processed is immersed in the cleaning liquid stored in the cleaning tank.

13. The substrate processing method according to claim 11, wherein the drying gas is supplied into the drying chamber in the vertically downward direction, under the condition where the substrate to be processed is immersed in the cleaning liquid stored in the cleaning tank.

14. The substrate processing method according to claim 11, wherein when the substrate to be processed is moved from the cleaning tank into the drying chamber with the drying gas being supplied into the drying chamber, the substrate to be processed is continuously moved from the cleaning tank into the drying chamber without being stopped.

15. The substrate processing method according to claim 11, wherein the drying chamber is hermetically closed, when the drying gas is supplied into the drying chamber in the obliquely upward direction ascendant from the substantially horizontal direction or the vertically upward direction after the movement of the substrate to be processed into the drying chamber has been finished.

16. The substrate processing method according to claim 11, wherein the drying gas is selectively discharged from the drying chamber, and when the drying gas is supplied into the drying chamber, the drying gas is discharged from the drying chamber, and, when the supply of the drying gas into the drying chamber is stopped, the discharge of the drying gas from the drying chamber is stopped.

17. The substrate processing method according to claim 11, wherein when the substrate to be processed is moved from the cleaning tank into the drying chamber, the substrate to be processed is moved from the cleaning tank into the drying chamber in such a manner that a transfer speed at which the substrate to be processed is moved from a condition where the substrate to be processed is just completely exposed from the cleaning liquid stored in the cleaning tank to a condition where the movement of the substrate to be processed into the drying chamber is finished, is greater than a transfer speed at which the substrate to be processed is moved from a condition where the substrate to be processed is accommodated in the cleaning tank to the condition where the substrate to be processed is just completely exposed from the cleaning liquid stored in the cleaning tank.

18. The substrate processing method according to claim 11, wherein the drying gas is formed of a steam of organic solvent.

* * * * *